US006982579B2

(12) United States Patent
Lee

(10) Patent No.: US 6,982,579 B2
(45) Date of Patent: Jan. 3, 2006

(54) DIGITAL FREQUENCY-MULTIPLYING DLLS

(75) Inventor: Seong-hoon Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 16 days.

(21) Appl. No.: 10/734,339

(22) Filed: Dec. 11, 2003

(65) Prior Publication Data

US 2005/0127964 A1 Jun. 16, 2005

(51) Int. Cl.
*H03L 7/06* (2006.01)

(52) U.S. Cl. ...................... 327/158; 327/161; 327/115; 327/116; 327/276; 327/395

(58) Field of Classification Search ................ 327/156, 327/158, 159, 160, 161, 269, 270, 271, 276, 327/277, 393, 395, 396, 115–121; 331/34, 331/57, 177 R
See application file for complete search history.

(56) References Cited

U.S. PATENT DOCUMENTS 4,985,639 A 1/1991 Renfrow et al.
5,355,097 A * 10/1994 Scott et al. ................. 331/1 A
5,463,337 A 10/1995 Leonowich ................ 327/158
5,663,665 A 9/1997 Wang et al.

(Continued)

OTHER PUBLICATIONS

Jong-Tae Kwak, *A Low Cost High Performance Register-Controlled Digital DLL for 1 Gbps x32 DDR SDRAM*, The 8th Korean Conference on Semiconductors, Feb. 2001.
Ramin Farjad-Rad, *A Low-Power Multiplying DLL for Low-Jitter Multigigahertz Clock Generation in Highly Integrated Digital Chips*, IEEE Journal of Solid-State Circuits, vol. 37,. Nov. 12, Dec. 2002, p. 1804-1812.

*Primary Examiner*—Timothy P. Callahan
*Assistant Examiner*—An T. Luu
(74) *Attorney, Agent, or Firm*—Fish & Neave IP Group of Ropes & Gray LLP; Michael J. Chasan

(57) ABSTRACT

Digital delay-locked loops (DLLs) and methods are provided for signal frequency multiplication. Analog delay elements of typical frequency-multiplying DLLs are replaced with digital and digitally-controlled elements including a variable delay line. The number of unit delay elements in the delay line can be selected to produce a desired output signal delay. Phase-mixing of multiple variable delay line outputs achieves finer delay-time adjustments.

25 Claims, 11 Drawing Sheets

U.S. PATENT DOCUMENTS

| | | | | |
|---|---|---|---|---|
| 5,751,665 | A | 5/1998 | Tanoi | |
| 5,789,927 | A | 8/1998 | Belcher | |
| 5,872,488 | A * | 2/1999 | Lai | 331/57 |
| 6,100,736 | A * | 8/2000 | Wu et al. | 327/159 |
| 6,194,916 | B1 | 2/2001 | Nishimura et al. | |
| 6,194,947 | B1 | 2/2001 | Lee et al. | 327/359 |
| 6,295,328 | B1 | 9/2001 | Kim et al. | 375/376 |
| 6,313,688 | B1 | 11/2001 | Lee et al. | 327/359 |
| 6,326,826 | B1 | 12/2001 | Lee et al. | 327/161 |
| 6,366,148 | B1 | 4/2002 | Kim | 327/262 |
| 6,393,083 | B1 | 5/2002 | Beukema | |
| 6,512,408 | B2 | 1/2003 | Lee et al. | 327/359 |
| 6,573,771 | B2 | 6/2003 | Lee et al. | 327/158 |
| 6,618,283 | B2 * | 9/2003 | Lin | 365/141 |
| 6,642,760 | B1 | 11/2003 | Alon et al. | 327/158 |
| 6,661,863 | B1 | 12/2003 | Toosky | 375/376 |
| 6,762,633 | B2 | 7/2004 | Lee | |
| 6,768,361 | B2 | 7/2004 | Kwak | |
| 6,812,763 | B1 | 11/2004 | Lin | |
| 2003/0219088 | A1 | 11/2003 | Kwak | 375/376 |
| 2004/0217789 | A1 * | 11/2004 | Kwak et al. | 327/158 |

* cited by examiner

DIGITAL FREQUENCY-MULTIPLYING DLLS

BACKGROUND OF THE INVENTION

This invention relates to frequency-multiplying delay-locked loops (DLLs). More particularly, this invention relates to digitally-controlled frequency-multiplying DLLs.

Frequency-multiplying DLLs typically generate a high-frequency clock signal based on a lower frequency reference signal. Such DLLs then attempt to maintain a specific phase relationship between the generated clock signal and that reference signal. A ring oscillator is used to generate an output signal approximately M times the frequency of the reference signal, where the value of M is selectable. Every M pulses of the output signal, the phase of the output signal and the reference signal are compared. The delay of the ring oscillator is then adjusted, if necessary, in response to the comparison. This resets the phase of the output signal with respect to the reference signal. Accordingly, any phase deviation that may occur can accumulate for only M cycles at most before being corrected. Often, the desired phase difference between the generated output signal and the reference signal is zero.

Conventional frequency-multiplying DLLs use analog delay units. The delay of the analog units is adjustable and can be varied by adjusting the supply voltage. These analog delay units are typically controlled by a charge pump and a loop filter. Typically, the output of an odd number of analog inverting delay units connected in series is fed-back to the input of the first unit to form a ring oscillator. The frequency at which the ring oscillator oscillates is dependent on the delay of the analog delay units. By adjusting that delay, the frequency can be varied. However, it is well known that analog designs are more difficult to mass produce within stated specifications and are less portable to various process technologies than digital designs.

In digitally-controlled frequency-multiplying DLLs, the adjustable analog delay units are replaced with digital variable delay lines. To vary the phase of an output signal using a digital variable delay line, the number, not the delay, of the delay units is varied. However, the smallest possible phase increment is typically limited to the delay through a single unit delay, which may not suffice for many applications.

In view of the foregoing, it would be desirable to be able to provide a digitally-controlled frequency-multiplying delay-locked loop.

It would also be desirable to be able to provide a digitally-controlled frequency-multiplying delay-locked loop with fine delay-time adjustment.

SUMMARY OF THE INVENTION

It is an object of this invention to provide a digitally-controlled frequency-multiplying delay-locked loop.

It is also an object of this invention to provide a digitally-controlled frequency-multiplying delay-locked loop with fine delay-time adjustment.

In accordance with the invention, a digital variable delay line replaces the analog delay units of a standard frequency-multiplying delay-locked loop (DLL). To produce a variable frequency ring oscillator, the number of digital delay units used in the ring oscillator is varied. The resolution of a DLL is a measure of the DLL's precision. The phase error of a DLL cannot generally be adjusted below the resolution. A digitally-controlled frequency-multiplying DLL having a variable delay line in accordance with the invention can achieve a resolution of $2^*t_{ud}$ for each oscillation of the variable delay line, where $t_{ud}$ is the time of one delay unit. An overall resolution of $2^*M^*t_{ud}$, where M is the multiplication factor of the DLL, can be achieved.

The invention also provides a digitally-controlled frequency-multiplying DLL with fine-tuning capabilities. Through the use of at least two variable delay lines and a single phase mixer (i.e., one phase mixer stage), the overall resolution provided by the DLL can be reduced by a factor of L to $(2^*M^*t_{ud})/L$, where L is the number of interpolated phases that can be produced by the phase mixer. Interpolated phases are the fractional phase shift increments of a delay unit that a phase mixer stage can shift the phase of the output signal. For example, if a phase mixer stage can shift the phase of the output signal in increments of 1⁄10 the unit delay, then L=10.

Multiple phase mixer stages can be added to provide further fine tuning capabilities. Each subsequent phase mixer stage reduces the overall resolution of the system by a further factor of L. For example, two phase mixer stages each having an L=10 reduces the overall resolution of the system by a factor of 100 (the first phase mixer stage allows the output to be adjusted in 1⁄10 increments of a delay unit, while the second phase mixer stage allows the output to be further adjusted in 1⁄10 increments of the first stage's 1⁄10 increments).

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention provides a digitally-controlled frequency-multiplying delay-locked loop (DLL) that provides programmable clock multiplication with little, if any, phase error.

Figure 1:
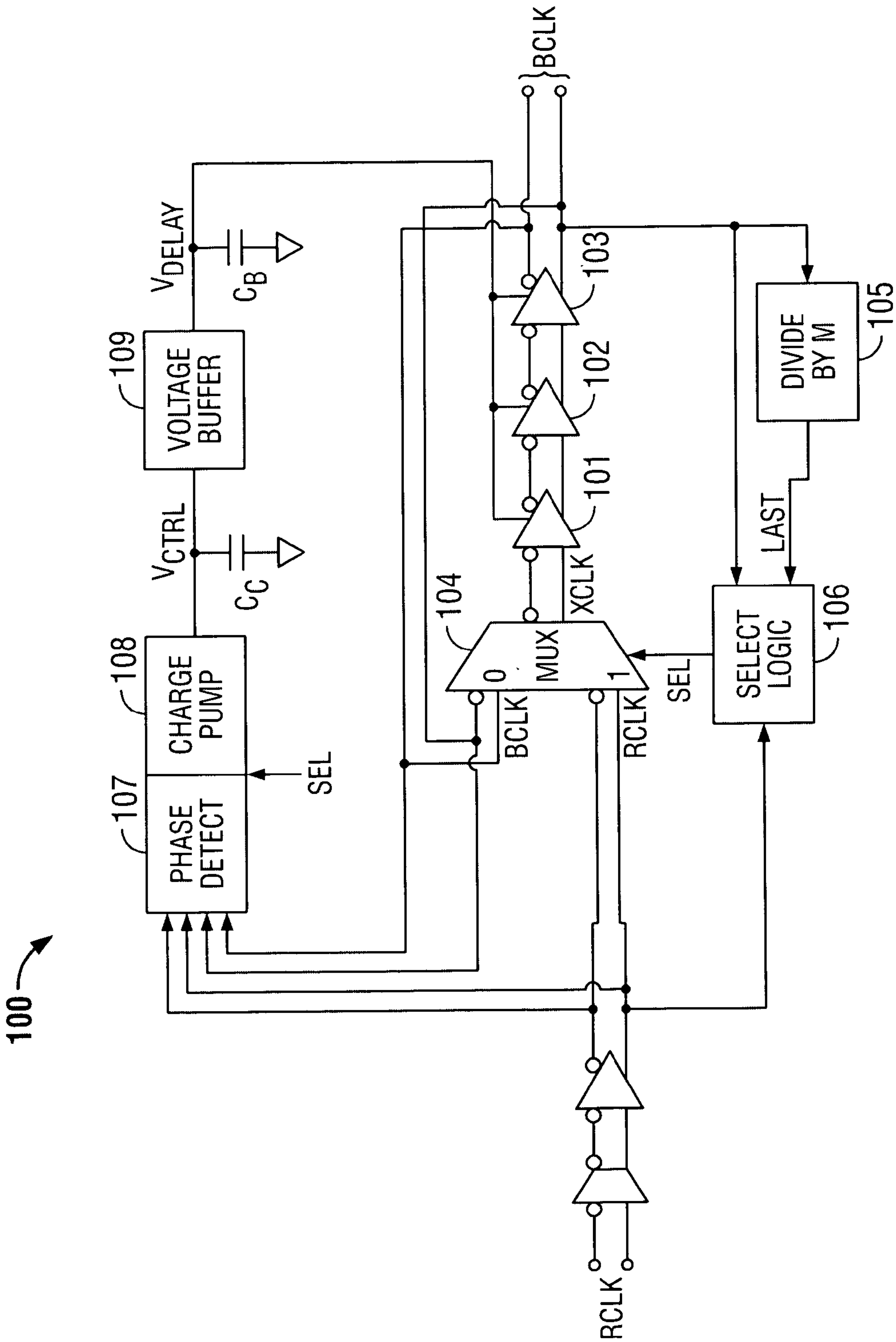
FIG. 1 is a block diagram of a typical analog frequency-multiplying delay-locked loop (DLL)

FIG. 1 shows a typical analog frequency-multiplying DLL 100. (Note that DLL 100 is a differential circuit and that, for clarity, pairs of differential signals will be referred to collectively in singular form. For example, instead of referring to BCLK and BCLK' (its complement), both will be referred to as BCLK.) Reference clock signal RCLK is input into DLL 100, and high-frequency output signal BCLK is output at a frequency M times the frequency of clock signal RCLK. The phase difference between RCLK and BCLK is ideally zero.

DLL 100 includes multiplexer 104 and delay elements 101–103 coupled to form a ring oscillator. Reference clock signal RCLK enters analog inverting delay element 101 via multiplexer 104. After the rising edge of signal RCLK is received, multiplexer 104 switches through the output of final inverting delay element 103. The output of multiplexer 104 is signal XCLK. The ring oscillator oscillates with a period of approximately twice the delay around inverting delay elements 101–103, forming high-frequency output signal BCLK. Programmable divide-by-M counter 105 counts the number of cycles of BCLK and generates signal pulse LAST every M cycles of BCLK. Pulse LAST triggers select logic 106 at the next falling transition of BCLK to generate signal SEL. SEL switches the output of multiplexer 104 to pass RCLK to analog inverting delay element 101, thus resetting the phase of the ring oscillator to the phase of RCLK. One advantage of this arrangement is that any phase error resulting from the ring oscillator accumulates over only M cycles of BCLK before the oscillator is reset to the phase of RCLK.

The ring oscillator is controlled by phase detector 107, charge pump 108, and voltage buffer 109. After M cycles of the high-frequency ring oscillator, when SEL is asserted, phase detector 107 measures the phase difference between RCLK and BCLK. With zero phase difference, one cycle of RCLK should occur for every M cycles of BCLK. The output of phase detector 107 causes charge pump 108 and voltage buffer 109 to change the loop control voltage, which controls the delay of inverting delay elements 101–103. Controlling the delay of inverting delay elements 101–103 controls the oscillation frequency of the ring oscillator. After each cycle of RCLK, the phase error (if any) over the M cycles of BCLK is detected and corrected. Once the phase error has been corrected (to preferably the minimum achievable value), DLL 100 is said to be "locked."

Frequency-multiplying DLL 100 relies on analog inverting delay elements 101–103, and their precise control, to minimize any phase error between RCLK and BCLK. Disadvantages of such analog elements are that they are more difficult to design, more difficult to mass produce consistently within specifications, and less portable to various process technologies than digital elements.

Figure 2:
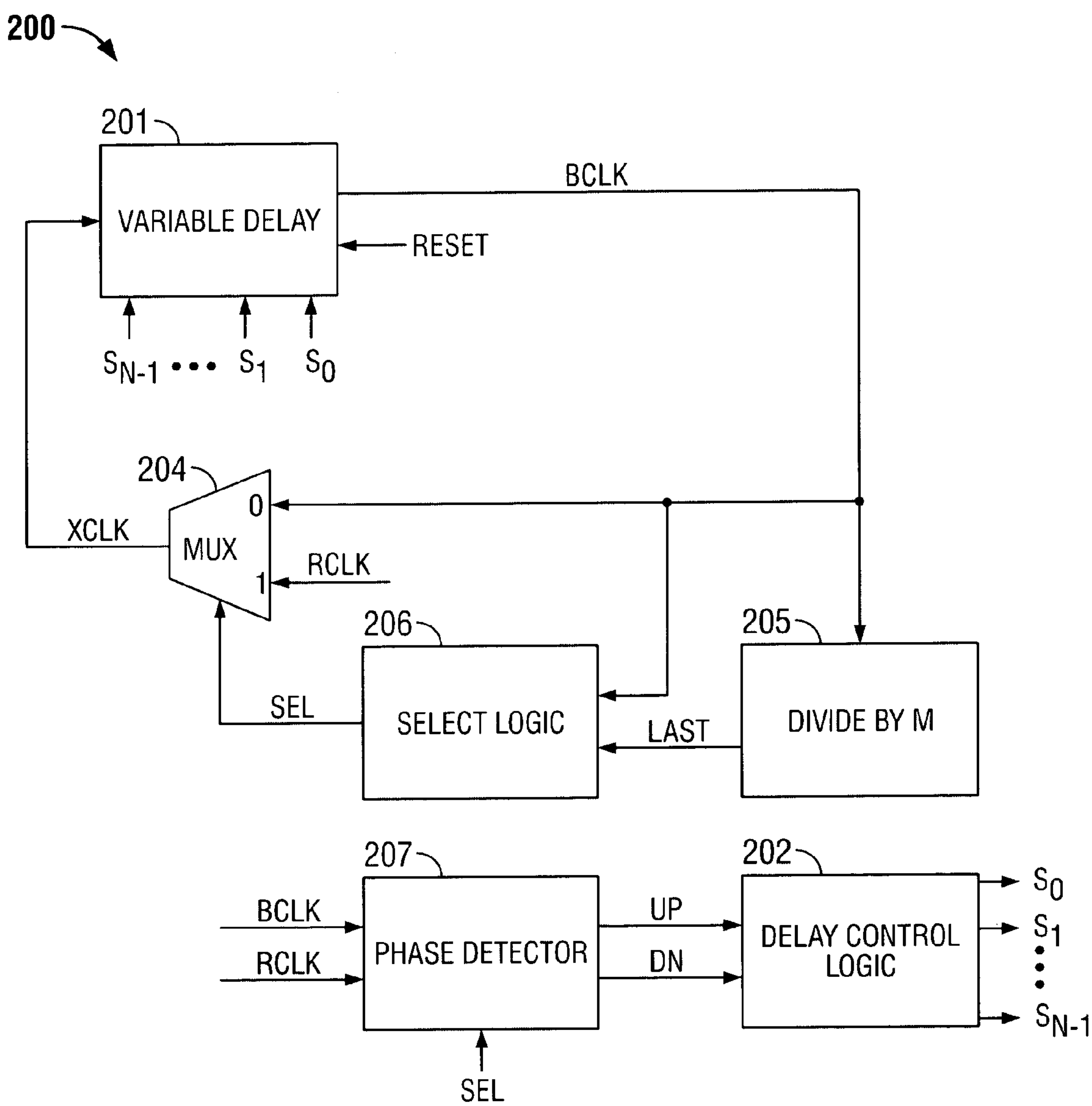
FIG. 2 is a block diagram of a digitally-controlled frequency-multiplying DLL according to the invention.

FIG. 2 shows digitally-controlled frequency-multiplying DLL 200 in accordance with the invention. Like frequency-multiplying DLL 100, digitally-controlled frequency-multiplying DLL 200 includes multiplexer 204, divide-by-M counter 205, select logic 206, and phase detector 207, which all operate in a similar or identical manner as their corresponding counterparts in DLL 100. DLL 200 preferably also includes variable delay 201 and delay control logic 202, which advantageously replaces inverting delay elements 101–103, charge pump 108 and voltage buffer 109.

Figure 3:
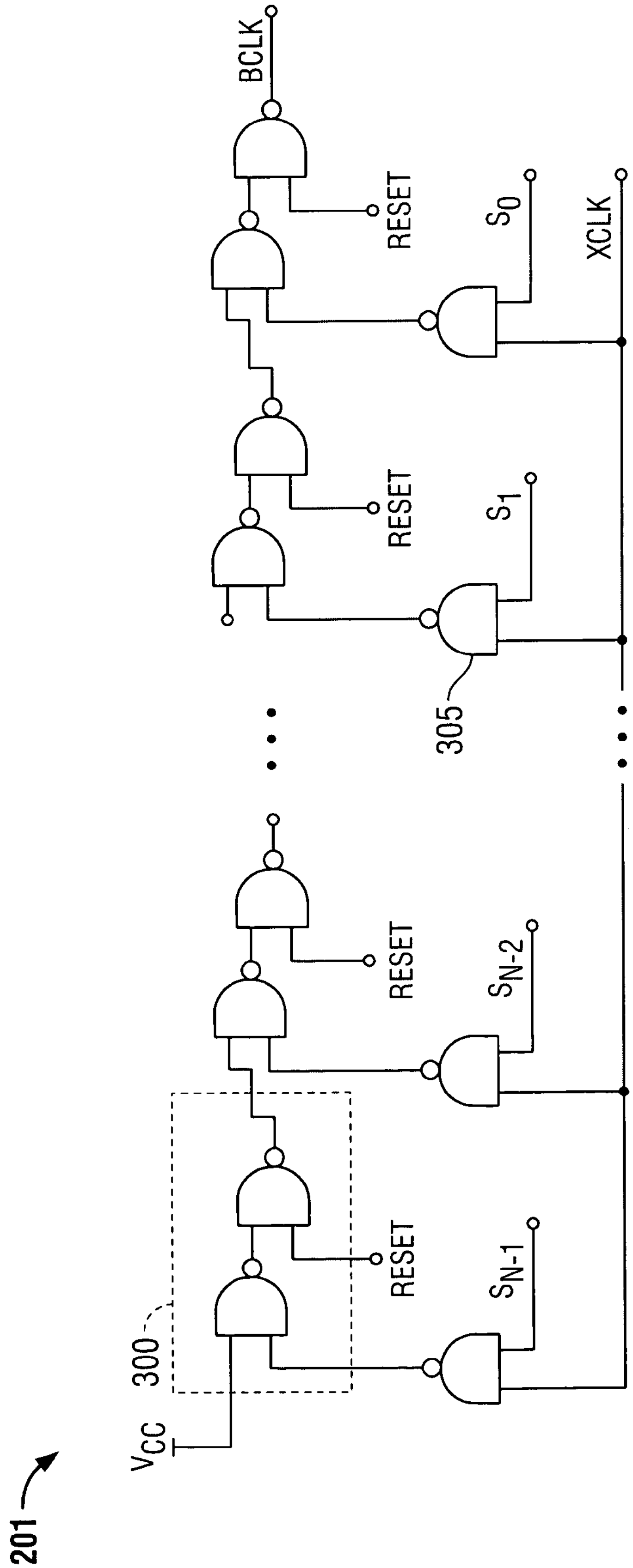
FIG. 3 is a block diagram of a variable delay line according to the invention.

An embodiment of variable delay 201 is shown in more detail in FIG. 3. Variable delay 201 includes a series of N unit delay elements 300 that preferably all have a propagation unit delay time of approximately $t_{ud}$. Variable delay 201 receives input signal XCLK and control inputs RESET and $S_0$ through $S_{N-1}$. Variable delay 201 outputs signal BCLK. During normal operation of variable delay 201, signal RESET is set to a HIGH logic state (i.e., the reset function is disabled; a LOW logic state activates the reset function) and all but one of control signals $S_0$ through $S_{N-1}$ are set to a LOW logic state. One control signal is set to a HIGH logic state. In one embodiment, signal $S_0$ is set HIGH at startup. When input signal XCLK is received, variable delay 201 outputs signal BCLK, which is an inverted and delayed version of XCLK. The length of the delay depends on which control signal $S_0$ through $S_{N-1}$ is set to a HIGH logic state. For example, if control signal $S_1$ is set to a HIGH logic state, the total delay of variable delay 201 is approximately $2.5*t_{ud}$ (i.e., the total delay time through NAND gate 305 and two delay elements 300 (those associated with signals $S_1$ and $S_0$)). If control signal $S_0$ is set to a HIGH logic state, the delay of variable delay 201 decreases by one delay unit (i.e., the delay time through one delay element 300).

When BCLK of variable delay 201 is fed-back to the XCLK input via multiplexer 204, a ring oscillator is formed. The oscillation period of the ring oscillator can be set from $3*t_{ud}$ to $(2N+1)*t_{ud}$.

Returning to FIG. 2, variable delay 201 is controlled by delay control logic 202, which is coupled to phase detector 207. Phase detector 207 measures the phase difference between RCLK and BCLK and sends control signals indicating that difference to delay control logic 202. For example, signal UP may indicate a positive phase difference to delay control logic 202 and that it should increase the delay provided by variable delay 201, while signal DN may do the opposite. Signals UP and DN may also indicate the magnitude of the phase difference. Delay control logic 202 sends appropriate control signals $S_0$ through $S_{n-1}$ to variable delay 201 to change the delay and preferably minimize any phase difference between RCLK and BCLK (assuming a zero phase difference is desired). In another embodiment of the invention, phase detector 207 may output a signal proportional to the measured phase difference, and delay control logic 202 may respond by issuing appropriate control signals to variable delay 201.

Advantageously, variable delay 201 allows digitally-controlled frequency-multiplying DLL 200 to vary the frequency of output BCLK. This variation is achieved by selecting the number of unit delay elements to use (e.g., 2 out of N or 5 out of N, where N is the total number of unit delay elements in the ring oscillator), as opposed to varying the delay times of each of a fixed number of analog delay elements.

Figure 4:
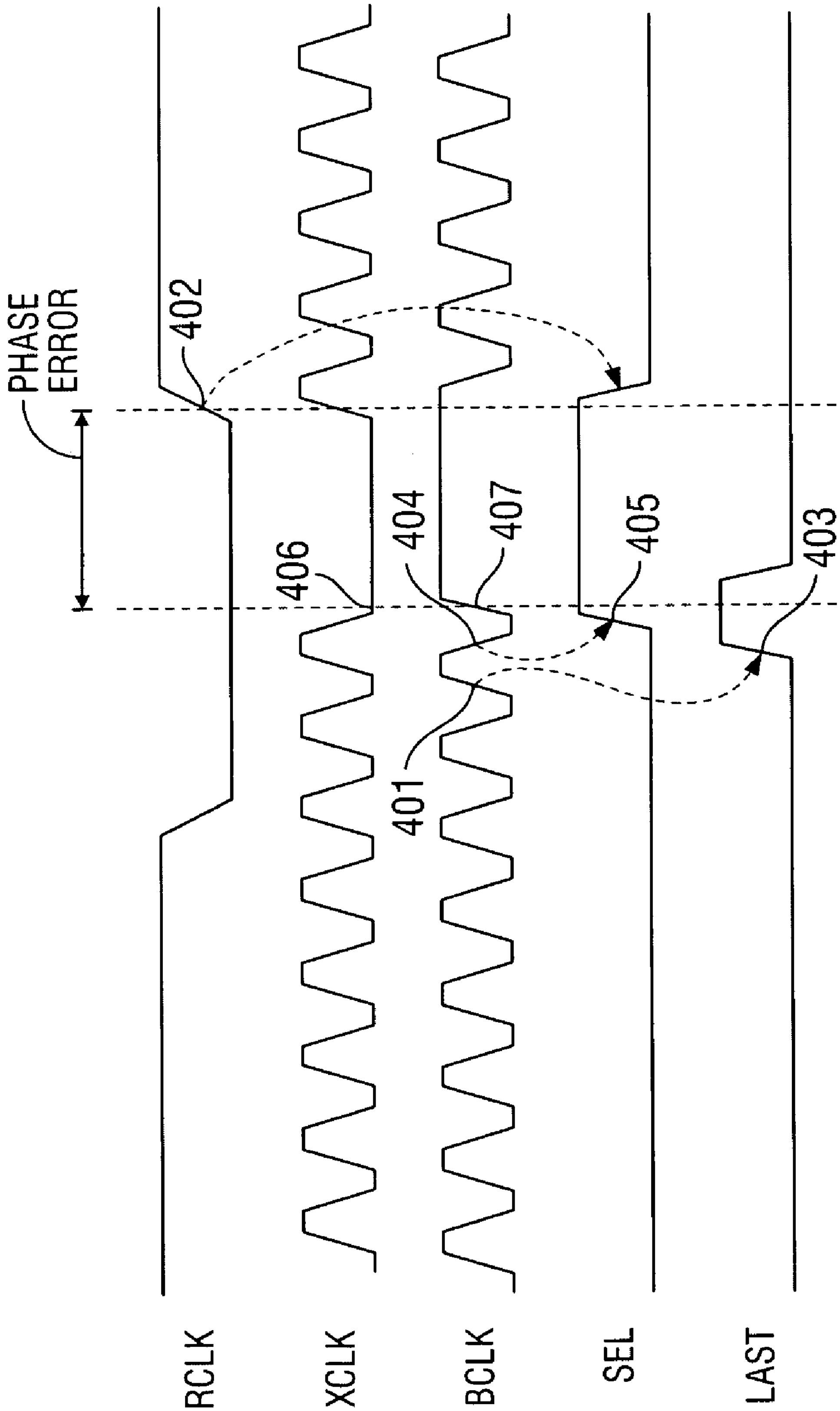
FIG. 4 is a timing diagram of input and output signals of an unlocked digitally-controlled frequency-multiplying DLL according to the invention.
Figure 5:
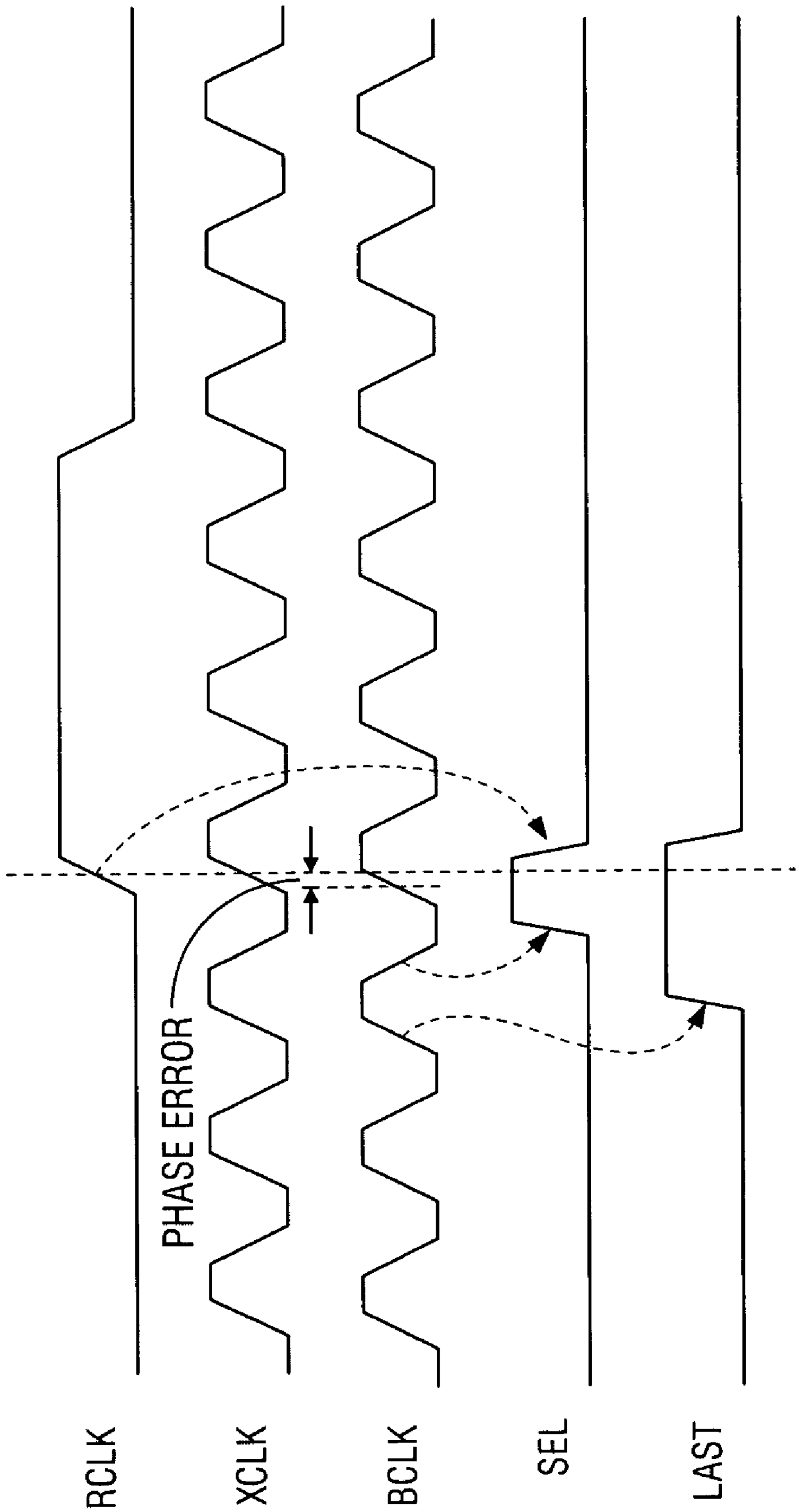
FIG. 5 is a timing diagram of input and output signals of a locked digitally-controlled frequency-multiplying DLL according to the invention.

The operation of digitally-controlled frequency-multiplying DLL 200 is illustrated in FIGS. 4 and 5, which show signal timings of unlocked and locked digitally-controlled frequency-multiplying DLLs, respectively.

Referring to FIG. 4, delay control logic 202 is set such that only $S_0$ is in a HIGH logic state. Variable delay 201 is therefore set to its minimum delay, and the ring oscillator frequency is set to its maximum. As a result, BCLK completes M cycles well before the rising edge 402 of RCLK. Note the phase error in this unlocked state. At the Mth clock rising transition 401 of BCLK, the divide-by-M counter 205 asserts signal LAST at 403, which activates select logic 206.

Select logic 206 asserts signal SEL at 405 after the BCLK falling transition 404. SEL switches multiplexer 204 at 406 to pass its RCLK input. During this period, the DLL stops oscillation. If stopping oscillation more quickly is necessary, RESET may be asserted as well. Phase detector 207, which is also activated by SEL, compares the rising transition 407 of BCLK with the rising transition 402 of RCLK and generates signals UP and DN (see FIG. 2) according to the polarity of the phase error. Delay control logic 202 then moves the HIGH state back and forth among $S_0$ to $S_{N-1}$ to reduce the phase error of the DLL. Select logic 206 deasserts SEL at the rising transition 402 of RCLK, which restarts the ring oscillator with its phase reset to the phase of RCLK.

FIG. 5 shows a timing diagram of a locked DLL, which occurs after variable delay 201 has been set to its most optimum setting and the phase error has been reduced to preferably its minimum value.

Although DLL 200 has many advantages over conventional analog DLLs (e.g., easier to design, more reliable manufacturing, and greater portability to various process technologies), performance of this embodiment may be limited by unit delay time ($t_{ud}$). Variable delay 201 is adjustable in delay increments resulting from each unit delay element 300. When adjusting BCLK, the phase difference between BCLK and RCLK cannot be adjusted to a precision finer than one unit delay time ($t_{ud}$). Thus, each oscillation can have a maximum precision of $2*t_{ud}$ (i.e., one unit delay for each rising and falling edge of the signal). This phase error accumulates over M oscillations. Thus the overall resolution of this embodiment is $2*M*t_{ud}$.

Figure 6:
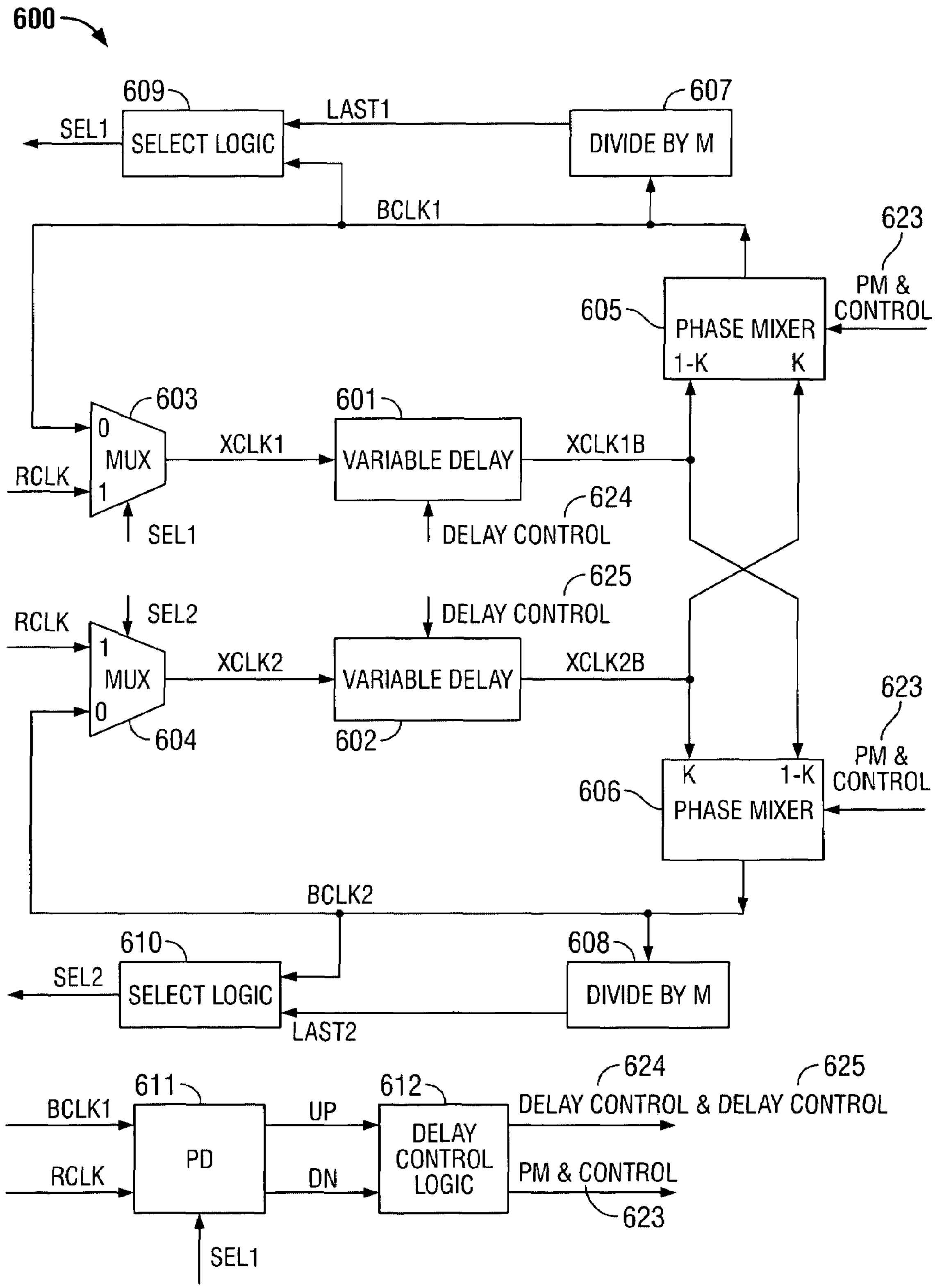
FIG. 6 is a block diagram of a digitally-controlled frequency-multiplying DLL with fine delay-time adjustment according to the invention.

FIG. 6 shows another embodiment of a digitally-controlled frequency-multiplying DLL in accordance with this invention. DLL 600 has fine delay-time adjustment and can adjust the oscillation period of high-frequency outputs BCLK1 and BCLK2 by increments smaller than one unit delay, thus achieving a resolution superior to DLL 200. DLL 600 includes two variable delays 601 and 602, two multiplexers 603 and 604, two phase mixers 605 and 606, two divide-by-M counters 607 and 608, two select logics 609 and 610, phase detector 611, and delay control logic 612. DLL 600 has two ring oscillator loops which are interconnected to phase mixers 605 and 606. The output of variable delays 601 and 602, XCLK1B and XCLK2B, are not directly fed-back to their respective multiplexers 603 and 604 as in the previous embodiment. Instead, XCLK1B and XCLK2B are each connected to both phase mixers 605 and 606.

Phase mixers 605 and 606 preferably have linear mixing characteristics and zero propagation delay. The output of the phase mixers are signals each having a phase equal to a weighted linear combination of the phases of the two input signals. The operation of phase mixers 605 and 606 can be expressed as follows:

$$\Phi_{BCLK1,BCLK2}=K*\Phi_{XCLK2B}+(1-K)*\Phi_{XCLK1B}$$

where k is a weighting factor. If phase mixers 605 and 606 generate L interpolated phases, then k can be set as k=p/L, where p=0, 1, 2, . . . , L.

Figure 7:
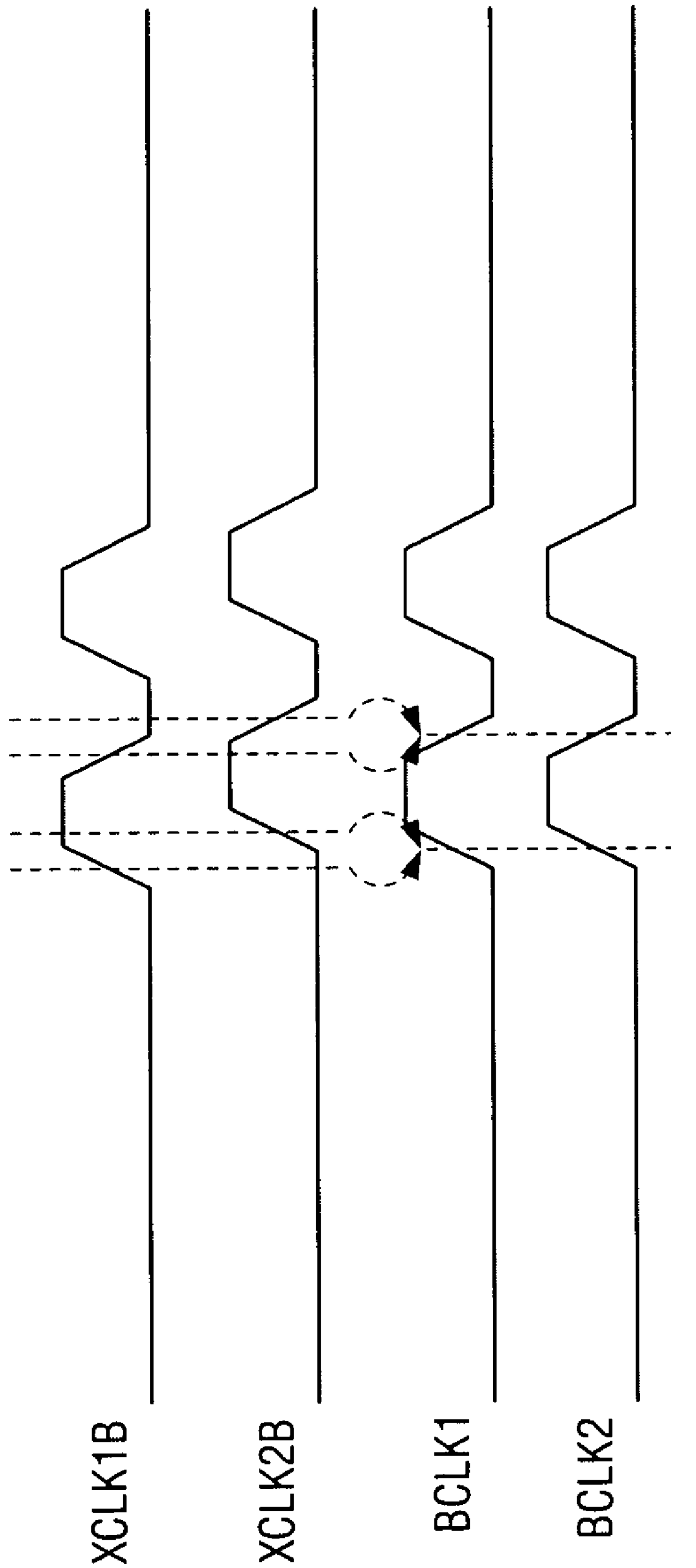
FIG. 7 is a timing diagram illustrating phase mixing.

FIG. 7 shows signal timings of phase mixers 605 and 606. For the signals shown, k is approximately 0.5. The phases of the two incoming signals XCLK1B and XCLK2B are therefore combined equally to form signals BCLK1 and BCLK2. Note that the rising and falling edges of BCLK1 and BCLK2 are each an average of the rising and falling edges of XCLK1B and XCLK2B, respectively. If k were set to another value, the output of the phase mixer would no longer be an equal average of the two signals, but would be weighted towards one or the other depending on the value of k.

Returning to FIG. 6, the output of phase mixer 605 is connected to divide-by-M counter 607, select logic 609, and multiplexer 603. The output of phase mixer 606 is connected to divide-by-M counter 608, select logic 610, and multiplexer 604. Phase mixing XCLK1B and XCLK2B to form BCLK1 and BCLK2 results in a smaller phase difference than possible with DLL 200, as illustrated in the timing diagrams of FIGS. 8 and 9.

Figure 8:
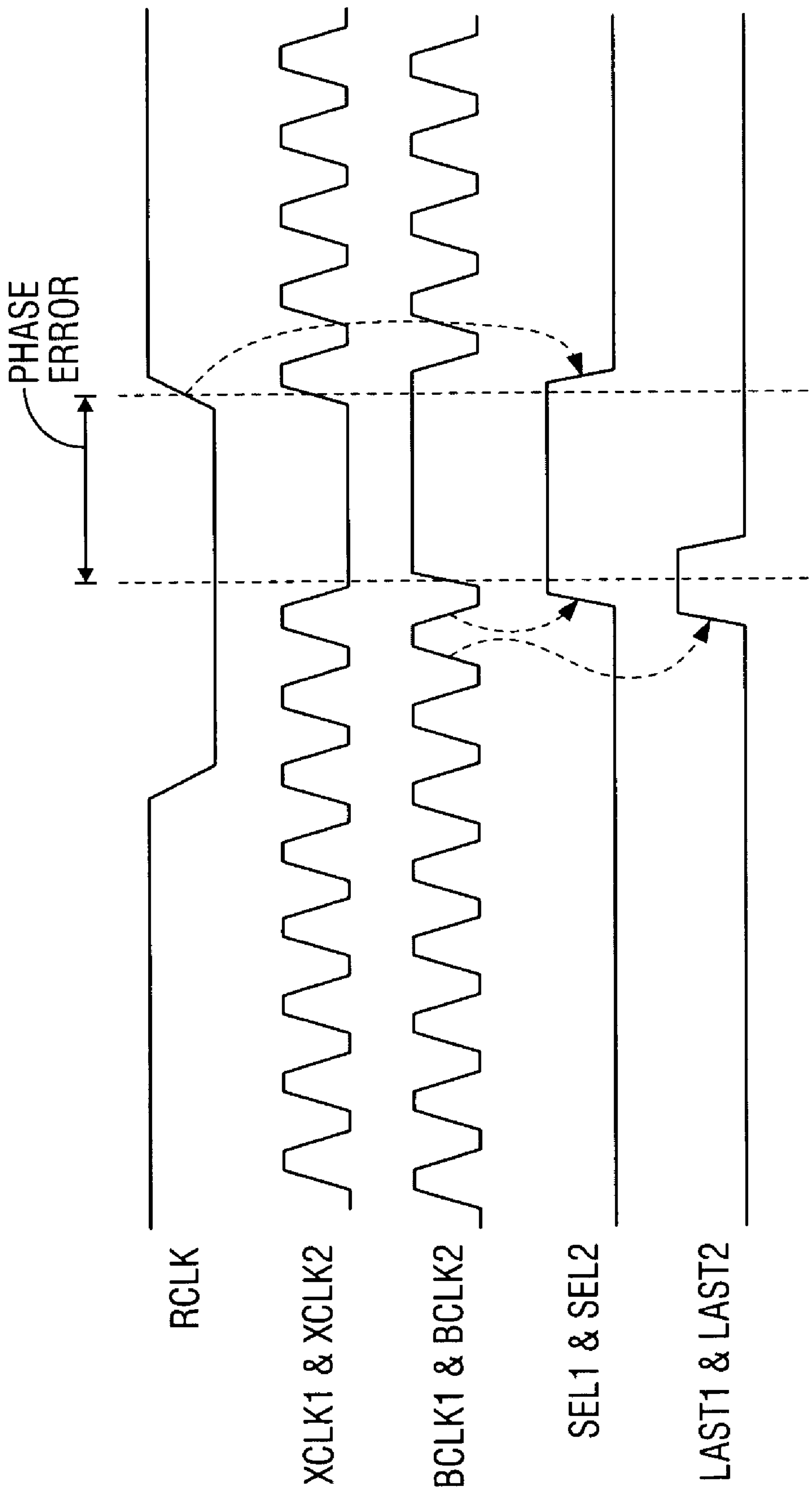
FIG. 8 is a timing diagram of input and output signals of an unlocked digitally-controlled frequency-multiplying DLL with fine delay-time adjustment according to the invention.

FIG. 8 shows input and output signals of digitally-controlled frequency-multiplying DLL 600 in an unlocked, startup state. Note that the phase error is similar to the phase error shown in FIG. 4 for the unlocked state of DLL 200.

Figure 9:
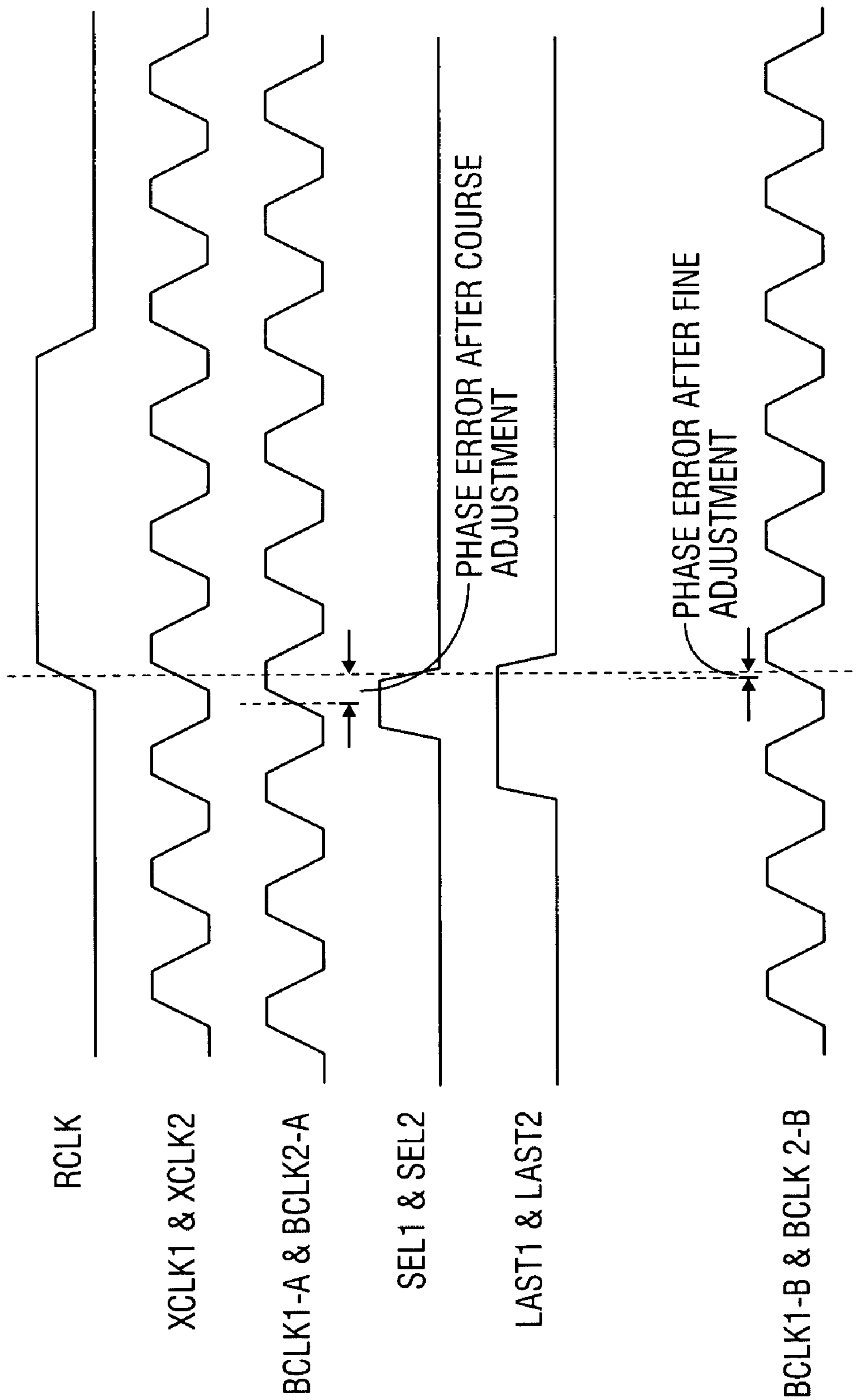
FIG. 9 is a timing diagram of input and output signals of a locked digitally-controlled frequency-multiplying DLL with fine delay-time adjustment according to the invention.

FIG. 9 shows input and output signals of digitally-controlled frequency-multiplying DLL 600 after coarse and fine tuning adjustments have been made. The phase error shown between the BCLK1-*a* and BCLK2-*a* waveform and the RCLK waveform represents an intermediate result of DLL 600 after coarse tuning has been completed (i.e., delay controls 624 and 625 of variable delays 601 and 602 are respectively set to their optimal settings). Coarse tuning is the type of tuning made by DLL 200. Thus, the reduced phase error shown for BCLK1-*a* and BCLK2-*a* is similar to the reduced phase error shown in FIG. 5 for DLL 200. The phase error shown between the BCLK1-*b* and BCLK2-*b* waveform and the RCLK waveform represents a final result of DLL 600 after fine tuning has been completed.

Fine tuning occurs after preferably optimal and identical settings for delay controls 624 and 625 are made. One of these delay controls is increased or decreased, generally by one unit time delay, depending on the polarity of the measured phase error. After this adjustment, delay control logic 612 adjusts PM (phase mixer) control 623 to a value of k which preferably results in the minimum phase error. DLL 600 is now in a locked state.

If outputs BCLK1 and BCLK2 of DLL 600 lose their lock with RCLK, and the measured phase error exceeds the range of fine tuning with phase mixers 605 and 606, variable delays 601 and 602 may be used to reestablish coarse tuning. After coarse tuning is completed, fine tuning may again be used to reestablish the preferably minimum phase error.

DLL 200 has a maximum resolution of $2*M*t_{ud}$. With fine delay-time adjustment, the minimum adjustable value for output signals BCLK1 and BCLK2 is equal to unit delay time ($t_{ud}$) divided by L ($t_{ud}/L$), where L is the number of phase interpolations provided by phase mixers 605 and 606. Thus, each oscillation can have a maximum precision of $2*t_{ud}/L$. Because phase error can accumulate over M oscillations, the overall resolution is $2*M*t_{ud}/L$, a factor of L smaller than a DLL of the invention without fine delay-time adjustment.

Digitally-controlled frequency-multiplying DLL 600 has one PM control 623 to control phase mixers 605 and 606. Because both phase mixers 605 and 606 are set to the same value, the outputs BCLK1 and BCLK2 are identical. Thus, there is no need for two separate divide-by-M counters 607 and 608 or select logics 609 and 610. However, with a few modifications, all of these components can be used to implement an even more precise embodiment of a DLL.

Figure 10:
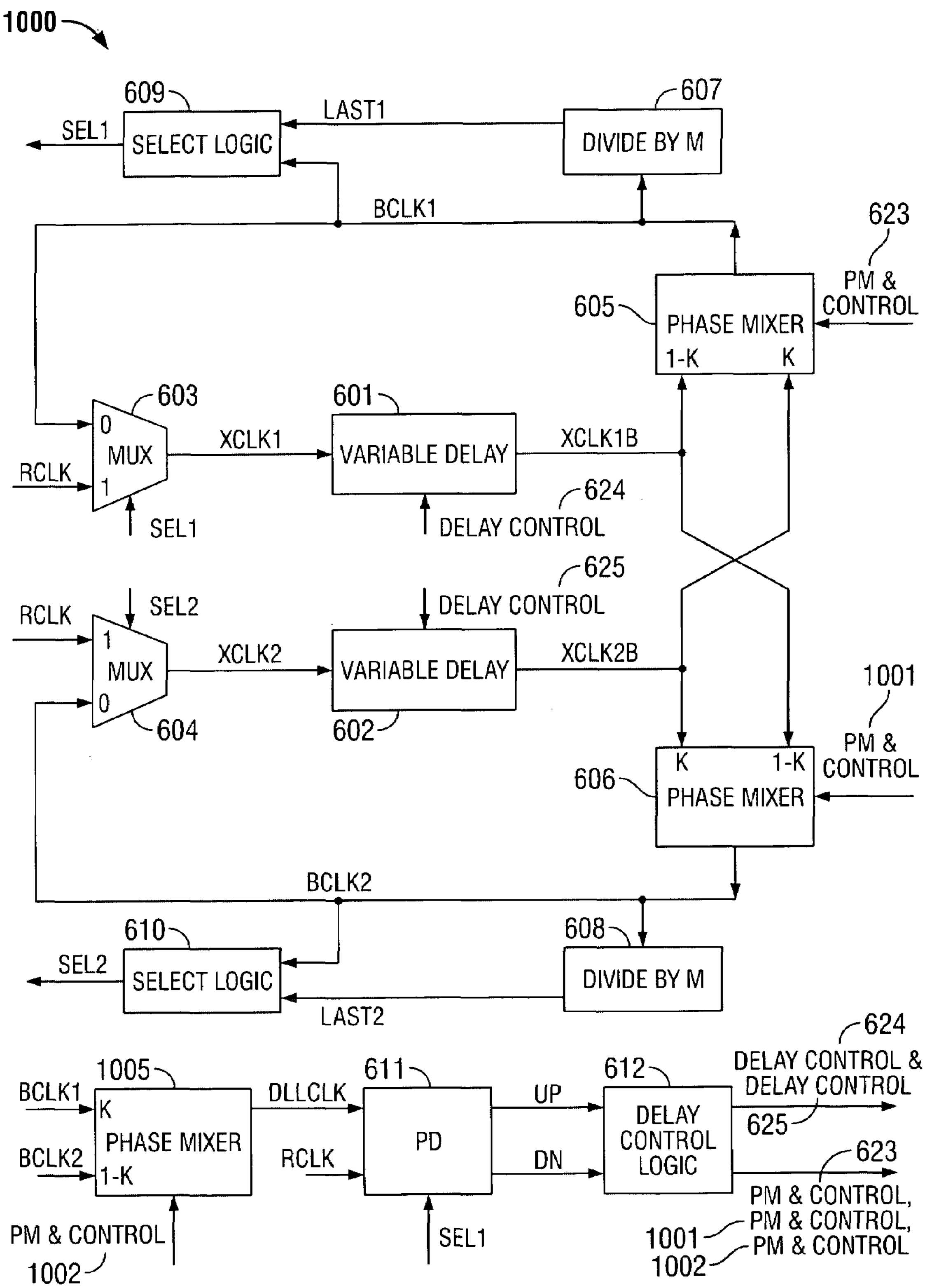
FIG. 10 is a block diagram of a digitally-controlled frequency-multiplying DLL with multiple stages of phase mixers for additional fine delay-time adjustment according to the invention.

FIG. 10 shows such an embodiment of a DLL in accordance with the invention. DLL 1000 permits separate adjustments to phase mixers 605 and 606 and adds a third phase mixer 1005 to phase mix their outputs. This adds an additional level of fine delay-time adjustment. After coarse tuning with variable delays 601 and 602, and fine tuning with phase mixers 605 and 606, another stage of fine tuning is advantageously performed with phase mixer 1005. The resolution of DLL 1000 is approximately $(2*M*t_{ud})/L^2$.

Depending of course on available circuit space, more stages of phase mixers can be added to DLL 1000 to achieve even finer resolution in accordance with the invention.

Figure 11:
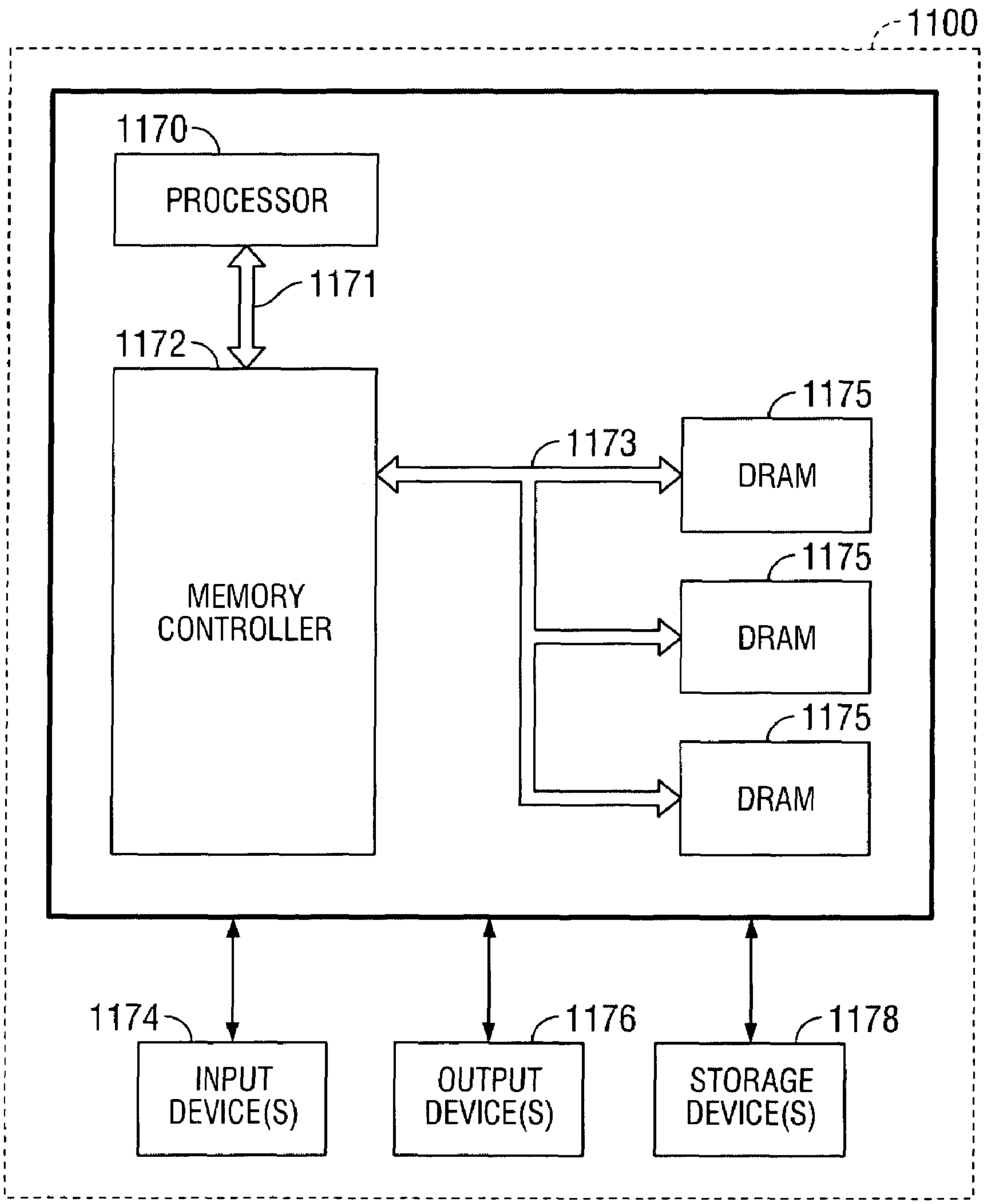
FIG. 11 is a block diagram of a system that incorporates the invention.

FIG. 11 shows a system that incorporates the invention. System 1100 includes a plurality of DRAM chips 1175, a processor 1170, a memory controller 1172, input devices 1174, output devices 1176, and optional storage devices 1178. Data and control signals are transferred between processor 1170 and memory controller 1172 via bus 1171. Similarly, data and control signals are transferred between memory controller 1172 and DRAM chips 1175 via bus 1173. One or more DRAM chips 1110 include a digital frequency-multiplying DLL in accordance with the invention. Input devices 1174 can include, for example, a keyboard, a mouse, a touch-pad display screen, or any other appropriate device that allows a user to enter information into system 1100. Output devices 1176 can include, for example, a video display unit, a printer, or any other appropriate device capable of providing output data to a user. Note that input devices 1174 and output devices 1176 can alternatively be a single input/output device. Storage devices 1178 can include, for example, one or more disk or tape drives.

Note that the invention is not limited to DRAM chips, but is applicable to other systems and integrated circuits that have frequency-multiplying DLLs.

Thus it is seen that digitally-controlled frequency-multiplying DLLs are provided. One skilled in the art will appreciate that the invention can be practiced by other than the described embodiments, which are presented for purposes of illustration and not of limitation, and the present invention is limited only by the claims which follow.

I claim:

1. A method of maintaining a desired phase relationship between a generated periodic signal and a periodic reference signal, said method comprising:

generating a first periodic signal with a first delay line and a second periodic signal with a second delay line, each delay line comprising a plurality of unit delays connected in series, the number of unit delays involved in said generating being selectable by digital signals, the difference between said selected number of unit delays in said first delay line and in said second delay line being at least one unit delay;

phase mixing said first and said second generated periodic signals according to an adjustable phase mixing ratio to produce a phase-mixed signal;

measuring a phase difference between said periodic reference signal and said phase-mixed signal after a plurality of cycles of said phase-mixed signal;

adjusting if necessary at least one of said phase mixing ratio and said number of unit delays in at least one of said first and said second delay lines based on said phase difference and said desired phase relationship; and generating said first and second periodic signals after said adjusting.

2. The method of claim 1 wherein said adjusting further comprises maintaining said selected number of unit delays in each of said first and said second delay lines while the magnitude of said measured phase difference is less than a certain value.

3. The method of claim 1 wherein said adjusting further comprises maintaining said phase mixing ratio when said selected number of unit delays in each of said first and said second delay lines are adjusted.

4. The method of claim 1 wherein said adjusting further comprises resetting said phase mixing ratio when said selected number of unit delays in each of said first and said second delay lines are adjusted.

5. The method of claim 1 wherein said adjusting further comprises maintaining said selected number of unit delays in each of said first and said second delay lines when said phase mixing ratio is adjusted.

6. The method of claim 1 the wherein said adjusting further comprises adjusting said selected number of unit delays in each of said first and said second delay line by the same number of said unit delays.

7. The method of claim 1 wherein said adjusting further comprises maintaining said phase mixing ratio while the magnitude of said measured phase difference is greater than a certain value.

8. The method of claim 7 wherein said certain value is equal to the delay time of one of said unit delays.

9. The method of claim 1 wherein said adjusting further comprises maintaining said phase mixing ratio while the magnitude of said measured phase difference is less than a certain value.

10. The method of claim 1 wherein said adjusting further comprises adjusting said selected number of unit delays in at least one of said first and said second delay lines when said phase mixing ratio cannot be further adjusted.

11. The method of claim 1 further comprising:

phase mixing said first and said second generated periodic signals according to a second adjustable phase mixing ratio to produce a second phase-mixed signal; and phase mixing said phase-mixed signal with said second phase-mixed signal to produce a third phase-mixed signal; wherein said measuring comprises:

measuring a phase difference between said periodic reference signal and said third phase-mixed signal after a plurality of cycles of said third phase-mixed signal.

12. The method of claim 11 wherein said phase mixing ratio and said second phase mixing ratio are equal.

13. A method of maintaining a desired phase relationship between a generated periodic signal and a periodic reference signal, said method comprising:

receiving said periodic reference signal;

generating a first periodic signal and a second periodic signal, each having a phase, in response to said receiving said periodic reference signal;

phase mixing said first and said second generated periodic signals according to an adjustable phase mixing ratio to produce a phase-mixed signal;

measuring said phase difference between said received periodic reference signal and said phase-mixed signal after a plurality of cycles of said phase-mixed signal;

adjusting, if necessary, via digital signals said phase mixing ratio in response to said measuring; and generating said first and second periodic signals after said adjusting.

14. A method of maintaining a desired phase relationship between a generated periodic signal and a periodic reference signal, said method comprising:

phase mixing a first and a second periodic signal according to a first adjustable phase mixing ratio to produce a first phase-mixed signal;

phase mixing said first and said second periodic signals according to a second adjustable phase mixing ratio to produce a second phase-mixed signal;

phase mixing said first and said second phase-mixed signals according to a third adjustable phase mixing ratio to produce a third phase-mixed signal;

measuring a phase difference between said periodic reference signal and said third phase-mixed signal after a plurality of cycles of said third phase-mixed signal; and adjusting, if necessary, via digital signals at least one of said first phase mixing ratio, said second phase mixing ratio, and said third phase mixing ratio in response to said measuring to maintain said desired phase relationship between said periodic reference signal and said third phase-mixed signal.

15. A digital delay-locked loop circuit comprising:

a first delay line having an input, an output, and a plurality of serially-connected unit delay elements, each said unit delay element selectable to directly receive said first delay line input, said output of said first delay line being fed-back via a first multiplexer to said first delay line input to form a loop, said first delay line loop operative to generate a periodic signal from at least the last serially-connected unit delay element;

a second delay line having an input, an output, and a plurality of serially-connected unit delay elements, each said unit delay element selectable to directly receive said second delay line input, said output of said second delay line being fed-back via a second multiplexer to said second delay line input to form a loop, said second delay line loop operative to generate a periodic signal from at least the last serially-connected unit delay element;

a phase mixer having a first input operative to receive said generated periodic signal of said first variable delay line, a second input operative to receive said generated periodic signal of said second variable delay line, a phase mixing ratio control input, and an output, said phase mixer operative to mix said generated periodic signals of said first and said second delay lines according to a digital phase mixing ratio control signal to generate a phase-mixed signal;

a phase detector having a first input operative to receive a periodic reference signal, a second input operative to receive said generated phase-mixed signal, and an output, said phase detector operative to detect a phase difference between said periodic reference signal and said generated phase-mixed signal; and control logic having an input operative to receive said output of said phase detector, said control logic operative to issue digital signals selecting one of said unit delay elements of said first delay line and one of said unit delay elements of said second delay line and to issue a digital phase mixing ratio control signal.

16. Apparatus for maintaining a desired phase relationship between a generated periodic signal and a periodic reference signal, said apparatus comprising:

means for generating a first periodic signal with a first delay line and a second periodic signal with second delay line, each delay line comprising a plurality of unit delays connected in series, the number of unit delays involved in said generating being selectable via digital signals, the difference between said selected number of unit delays in said first delay line and said second delay line being at least one unit delay;

means for phase mixing said first and said second generated periodic signals according to an adjustable phase mixing ratio to produce a phase-mixed signal;

means for measuring a phase difference between said periodic reference signal and said phase-mixed signal after a plurality of cycles of said phase-mixed signal;

means for adjusting if necessary at least one of said phase mixing ratio and said number of unit delays in at least one of said first and said second delay lines based on said phase difference and said desired phase relationship; and means for generating said first and second periodic signals after said adjusting.

17. The apparatus of claim 16 wherein said means for adjusting further comprises means for maintaining said selected number of unit delays in each of said first and said second delay lines while the magnitude of said measured phase difference is less than a certain value.

18. The apparatus of claim 16 the wherein said means for adjusting further comprises means for adjusting said selected number of unit delays in each of said first and said second delay line by the same number of said unit delays.

19. The apparatus of claim 16 wherein said means for adjusting further comprises means for maintaining said phase mixing ratio while the magnitude of said measured phase difference is greater than a certain value.

20. The apparatus of claim 16 wherein said means for adjusting further comprises means for maintaining said phase mixing ratio while the magnitude of said measured phase difference is less than a certain value.

21. The apparatus of claim 16 wherein said means for adjusting further comprises means for adjusting said selected number of unit delays in at least one of said first and said second delay lines when said phase mixing ratio cannot be further adjusted.

22. The apparatus of claim 16 further comprising:

means for phase mixing said first and said second generated periodic signals according to a second adjustable phase mixing ratio to produce a second phase-mixed signal; and means for phase mixing said phase-mixed signal with said second phase-mixed signal to produce a third phase-mixed signal; wherein said means for measuring comprises:

means for measuring a phase difference between said periodic reference signal and said third phase-mixed signal after a plurality of cycles of said third phase-mixed signal.

23. The apparatus of claim 22 wherein said phase mixing phase mixing ratio and said second phase mixing ratio are equal.

24. Apparatus for maintaining a desired phase relationship between a generated periodic signal and a periodic reference signal, said apparatus comprising:

means for phase mixing a first and a second periodic signal according to a first adjustable phase mixing ratio to produce a first phase-mixed signal;

means for phase mixing said first and said second periodic signals according to a second adjustable phase mixing ratio to produce a second phase-mixed signal;

means for phase mixing said first and said second phase-mixed signals according to a third adjustable phase mixing ratio to produce a third phase-mixed signal;

means for measuring said phase difference between said periodic reference signal and said third phase-mixed signal after a plurality of cycles of said third phase-mixed signal; and means for adjusting at least one of said first phase mixing ratio, said second phase mixing ratio, and said third phase mixing ratio in response to said measuring to maintain said desired phase relationship between said periodic reference signal and said third phase-mixed signal.

25. A computer system comprising:

a processor;

a memory controller coupled to said processor; and a plurality of dynamic random access memory (DRAM) chips coupled to said memory controller, at least one of said DRAM chips comprising a delay-locked loop circuit comprising:

a first delay line having an input, an output, and a plurality of serially-connected unit delay elements, each said unit delay element selectable to directly receive said first delay line input signal, said output of said first delay line being fed-back via a first multiplexer to said first delay line input to form a loop, said first delay line loop operative to generate a periodic signal from at least the last serially-connected unit delay element;

a second delay line having an input, an output, and a plurality of serially-connected unit delay elements, each said unit delay element selectable to directly receive said second delay line input, said output of said second delay line being fed-back via a second multiplexer to said second delay line input to form a loop, said second delay line loop operative to generate a periodic signal from at least the last serially-connected unit delay element;

a phase mixer having a first input operative to receive said generated periodic signal of said first delay line, a second input operative to receive said generated periodic signal of said second delay line, a phase mixing ratio control input, and an output, said phase mixer operative to mix said generated periodic signals of said first and said second delay lines according to a digital phase mixing ratio control signal to generate a phase-mixed signal;

a phase detector having a first input operative to receive a periodic reference signal, a second input operative to receive said generated phase-mixed signal, and an output, said detector operative to detect a phase difference between said periodic reference signal and said generated phase-mixed signal; and control logic having an input operative to receive said output of said phase detector, said control logic operative to issue digital signals selecting one of said unit delay elements of said first delay line and one of said unit delay elements of said second delay line and to issue a digital phase mixing ratio control signal.

* * * * *